United States Patent
Wu et al.

(10) Patent No.: US 6,963,213 B1
(45) Date of Patent: Nov. 8, 2005

(54) AUTO-RECOVERY WAFER TESTING APPARATUS AND WAFER TESTING METHOD

(75) Inventors: Chiou-Ping Wu, Hsinchu (TW); Hsiu-Min Lin, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/710,670

(22) Filed: Jul. 28, 2004

(30) Foreign Application Priority Data

Apr. 19, 2004 (TW) .............................. 93110813 A

(51) Int. Cl.⁷ ............................................ G01R 31/26

(52) U.S. Cl. ................... 324/765; 324/158.1

(58) Field of Search .......................... 324/158.1, 765, 324/759, 763; 365/228; 713/193; 702/108; 714/13, 15, 24

(56) References Cited

U.S. PATENT DOCUMENTS

| | | | |
|---|---|---|---|
| 6,687,315 B2 * | 2/2004 | Keevill et al. ............... | 375/341 |
| 6,745,345 B2 * | 6/2004 | Cabezas et al. ............... | 714/41 |

* cited by examiner

Primary Examiner—Vinh Nguyen
Assistant Examiner—Trung Q Nguyen
(74) Attorney, Agent, or Firm—Jianq Chyun IP office

(57) ABSTRACT

Auto-recovery wafer testing apparatus and wafer testing method are provided. The wafer testing apparatus includes a main system, a tester and a real-time accessing module. The main system controls the process of the wafer testing. The tester is electrically coupled to the main system for receiving commands from the main system to perform testing on a plurality of chips sequentially and output the testing data correspondingly. The real-time accessing module is electrically coupled to the tester for simultaneously accessing the testing data. In an event when the testing is accidentally interrupted, the tester can produce auto-recovery data according to the testing data saved in the real-time accessing module, and continue testing, based on the auto-recovery data, from the chip being last but incompletely tested. The use of the wafer testing apparatus and method can save testing time and enhance the production efficiency.

7 Claims, 2 Drawing Sheets

AUTO-RECOVERY WAFER TESTING APPARATUS AND WAFER TESTING METHOD

CROSS REFERENCE TO RELATED APPLICATIONS

This application claims the priority benefit of Taiwan application serial no. 93110813, filed Apr. 19, 2004.

BACKGROUND OF INVENTION

1. Field of the Invention

The present invention generally relates to a wafer testing apparatus and wafer testing method, and more particularly relates to an auto-recovery wafer testing apparatus and wafer testing method.

2. Description of the Related Art

In today's society of information explosion, the market for the use of multimedia expends dramatically, which further induces the development of electronic devices moving towards digitalization, network accessibility, regional connection, and personalization. Responding to the demands, it is necessary for integrated circuits devices to meet the requirements of high-speed treatment, multi-functionality, integration, miniaturization and cost effectiveness. As a consequence, semiconductor manufacturing processes are becoming more miniaturized and with higher density. In semiconductor industry, IC manufacturing processes usually include three steps: wafer manufacturing, IC manufacturing, and IC packaging. The foregoing steps further require various wafer testing procedures to detect defective chips for ensuring high quality and yield.

Wafer testing can be divided basically into two portions, i.e., wafer probing and sorting during the manufacturing processes and final test following the packaging process. Wherein, wafer probing is performed after the finish of each manufacturing process, in which a testing apparatus (e.g., a wafer prober) is used to test chips on the wafer to classify the chips based on their individual electronic properties, so that the defective chips can be screened out from the subsequent manufacturing processes and thus manufacturing costs can be reduced.

In addition, a laser trimming procedure can be performed for chips that have spare circuits. First, the data obtained in the preceding processes are analyzed and characterized to sort out the data, such as the location of the chips and the layout of the circuits, that need repair. Next, a laser trimmer is used to perform a trimming process on the defective chips based on the repairable data. Thus, the foregoing testing steps of wafer probing, laser trimming and final test are critical steps for ensuring product quality and production efficiency as well as reducing manufacturing costs.

However, during the conventional processes of the foregoing wafer probing, laser trimming or final test step, interruptions may occur accidentally due to a breakdown of the testing apparatus (e.g., probing card and laser trimmer) or other unforeseeable causes. When that happens, the testing data for the chips that have been tested on a wafer will be lost upon the interruption of the system. Thus, when the problems causing the breakdown are solved or a new testing apparatus is used to continue the testing, the testing apparatus has to be set back to the initial position and the testing must be performed again on the chips at the initial position. Such repetitive testing processes due to data loss may cause damages on the chips through multiple testing processes, and the resetting of the testing apparatus will also lengthen the entire trimming process to cause the increase of the manufacturing cost and decrease of the production efficiency.

SUMMARY OF INVENTION

In view of the above, the present invention is to provide an auto-recovery wafer testing method, whereby, whenever a testing is accidentally interrupted and resumption of the testing process becomes necessary, a testing unit is able to return to the testing position prior to the interruption of the system for saving testing time and production costs.

The present invention is further to provide an auto-recovery wafer testing apparatus, which, after a testing process is interrupted and resumed, is able to return to the testing position prior to the interruption for continuing the testing process and saving testing time and production costs.

Accordingly, the present invention provides an auto-recovery wafer testing method. A first testing step is carried out to test sequentially a plurality of chips on a wafer and save the real-time testing data for each of the chips. Whenever the testing is accidentally interrupted, an auto-recovery data generating process is then carried out to generate auto-recovery data based on the saved testing data. Next, a second testing step is carried out, based on the auto-recovery data, to resume the testing from the chip being last but incompletely tested.

According to one preferred embodiment of this invention, the above-mentioned first testing step is carried out, for example, by using a first testing unit to test chips and output testing data for each of the chips, and, at the mean time, by using a real-time accessing module to save the real-time testing data for each of the chips.

Moreover, in the preferred embodiment of this invention, the auto-recovery wafer testing method further includes a problem-eliminating step, after the step of generating the auto-recovery data and before the second testing step, so as to ensure the first testing unit operating property.

Further, in the preferred embodiment of this invention, the second testing step is carried out, for example, by using the first testing unit to resume the testing on the chips based on the auto-recovery data. In addition, the wafer testing method further includes a transfer step, after the step of generating the auto-recovery data and before the second testing step, to transfer the wafer from the first testing unit to a second testing unit. Thus, the second testing unit can be used for continuing the testing, based on the automatically recovered data, from the chip being last but incompletely tested.

The present invention further provides an auto-recovery wafer testing apparatus suitable to test a plurality of chips on a wafer. The wafer testing apparatus includes, for example, a main system, a tester, and a real-time accessing module. The main system is used to control the overall wafer testing process, and the tester is electrically connected to the main system for receiving commands from the main system so as to test the chips and output the corresponding testing data. In addition, the real-time accessing module is electronically coupled to the testing unit for saving the real-time testing data. Whenever the testing is accidentally interrupted, the testing unit generates an auto-recovery data, based on the real-time testing data saved by the real-time accessing module, and completes the unfinished testing on the chips.

According to one preferred embodiment of this invention, the tester of the foregoing auto-recovery wafer testing apparatus includes, for example, a testing unit and a control module. Wherein, the testing unit is used to test the chips and output accordingly the testing data, while the control module is electronically coupled to the main system, the real-time accessing module, and the testing unit. In addition, the control module receives commands from the main system to control the testing unit during the testing and output the corresponding testing data to the real-time module. Whenever the testing is accidentally interrupted, the control module generates auto-recovery data based on the testing data saved in the real-time accessing module so as to control the testing unit to accomplish the testing process.

In the preferred embodiment of this invention, the foregoing testing unit can be, for example, a prober or a laser trimmer.

In conclusion, the present invention provides an auto-recovery wafer testing data apparatus and wafer testing method. Wherein, a real-time accessing module is used to record the testing data spontaneously when the testing is finished for each of the chips. Whenever an accidental interruption occurs and resumption of the testing becomes necessary, the control module is then able to perform an auto-recovery data generating step, and the second testing step will be carried out, based on the prior testing data to finish the interrupted testing on the chips of the wafer. It is worthy of notice that the second testing step can be, for example, carried out on the first testing unit after a problem-eliminating step, or carried out on the second testing unit after the wafer is transferred from the first testing unit to the second testing unit via a transfer step. Use of the auto-recovery wafer apparatus and method of this invention can be used to save time spent on restarting the testing process due to testing interruption, avoid damages of chips due to repetitive testing, and thus increase the production efficiency.

It is to be understood that both the foregoing general description and the following detailed description are exemplary, and are intended to provide further explanation of the invention as claimed.

DETAILED DESCRIPTION

The auto-recovery wafer testing apparatus and wafer testing method of this invention are suitable to, for example, perform wafer probing, laser trimming or final test on a plurality of chips on a wafer in a semiconductor manufacturing process.

Figure 1:
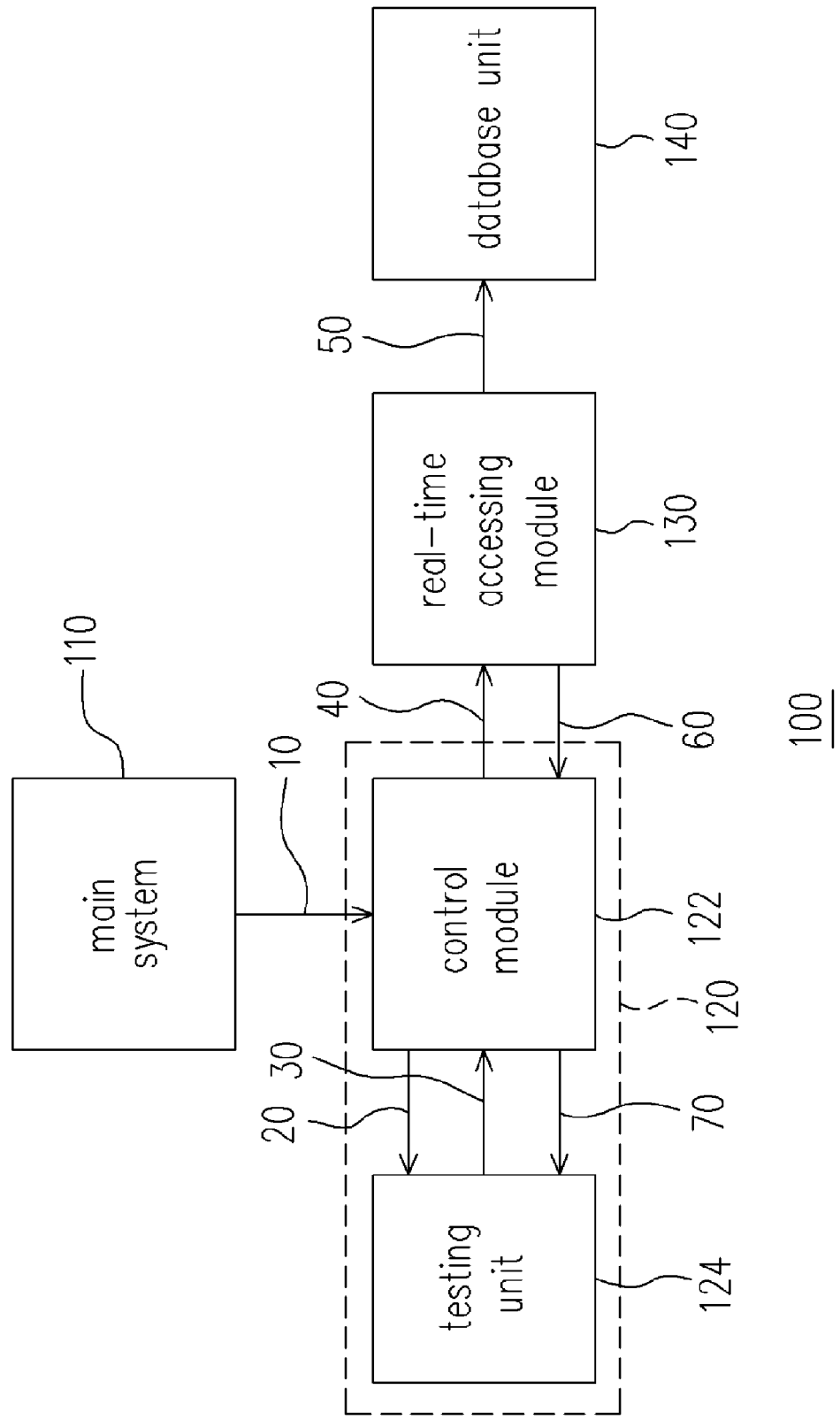
FIG. 1 is a block diagram schematically illustrating an auto-recovery wafer testing apparatus according to the present invention.

FIG. 1 is a block diagram schematically illustrating an auto-recovery wafer testing apparatus according to the present invention. The wafer testing apparatus 100 includes a main system 110, a tester 120, a real-time accessing module 130, and a database unit 140. The main system 110 is, for example, a manufacturing execution system (MES) for controlling the overall wafer testing process that involves manufacturing parameters such as wafer transferring, manufacture category, wafer batch numbers, wafer serial number, manufacture time.

Referring further to FIG. 1, the tester 120 includes, for example, a control module 122 and a testing apparatus 124, wherein the testing unit 124 is, for example, a wafer prober for wafer probing, and the control module 122 is electronically coupled to the main system 110, the real-time accessing module 130 and the testing unit 124. The control module 122, after receiving commands from the main system 110 (step 10), controls the testing unit 124 for stepwise testing the chips on the wafer in a specified batch (step 20). Upon the completion of the testing on each of the chips, the testing unit 124 sends the testing result back to the control module 122 (step 30), and the control module 122 outputs the corresponding testing data to the real-time module 130 (step 40) for instantaneously saving the testing data of each of the chips. When testing is finished for all chips on the specific wafer, the real-time accessing module 130 sends the testing data for all chips on the wafer to the database unit (step 50).

Comparing with the conventional wafer testing apparatus, the wafer testing apparatus 100 of this invention has additionally a real-time accessing module 130 for instantaneously saving the testing data of each chip, and thus whenever the testing process is accidentally interrupted, the prior obtained testing data can be saved in the real-time accessing module 130. Therefore, once the problem causing the interruption is solved, the control module 122 is capable of reading the saved testing data (step 60), and generates corresponding auto-recovery data, based on wafer batch number, wafer serial number, process specification (e.g., testing sequence of the wafer and specification for the apparatus), and other parameters provided by the main system (step 70). As a result, the wafer testing apparatus 100 returns to the status prior to the interruption and the testing unit 124 is directed back to the chip of the wafer being tasted at the time when the interruption occurred and continues to perform the testing.

Of course, if the problem causing the interruption cannot be promptly solved, the wafer then can be moved to another test unit, and, based on the foregoing auto-recovery data, the testing unit can be directed back to the chip of the wafer being tasted at the time when the interruption occurred and continues to perform the testing.

It is worthy to be noticed that the real-time accessing module, as described in the foregoing embodiment of this invention, can operate either independently from the tester or as a part of the tester. In addition, through rewriting the relevant programs, the database unit can also have functions of a real-time accessing module so as to provide instantaneously saved testing data of the wafer testing process and therefore can automatically recover the testing data after the interruption during the testing process.

Figure 2:
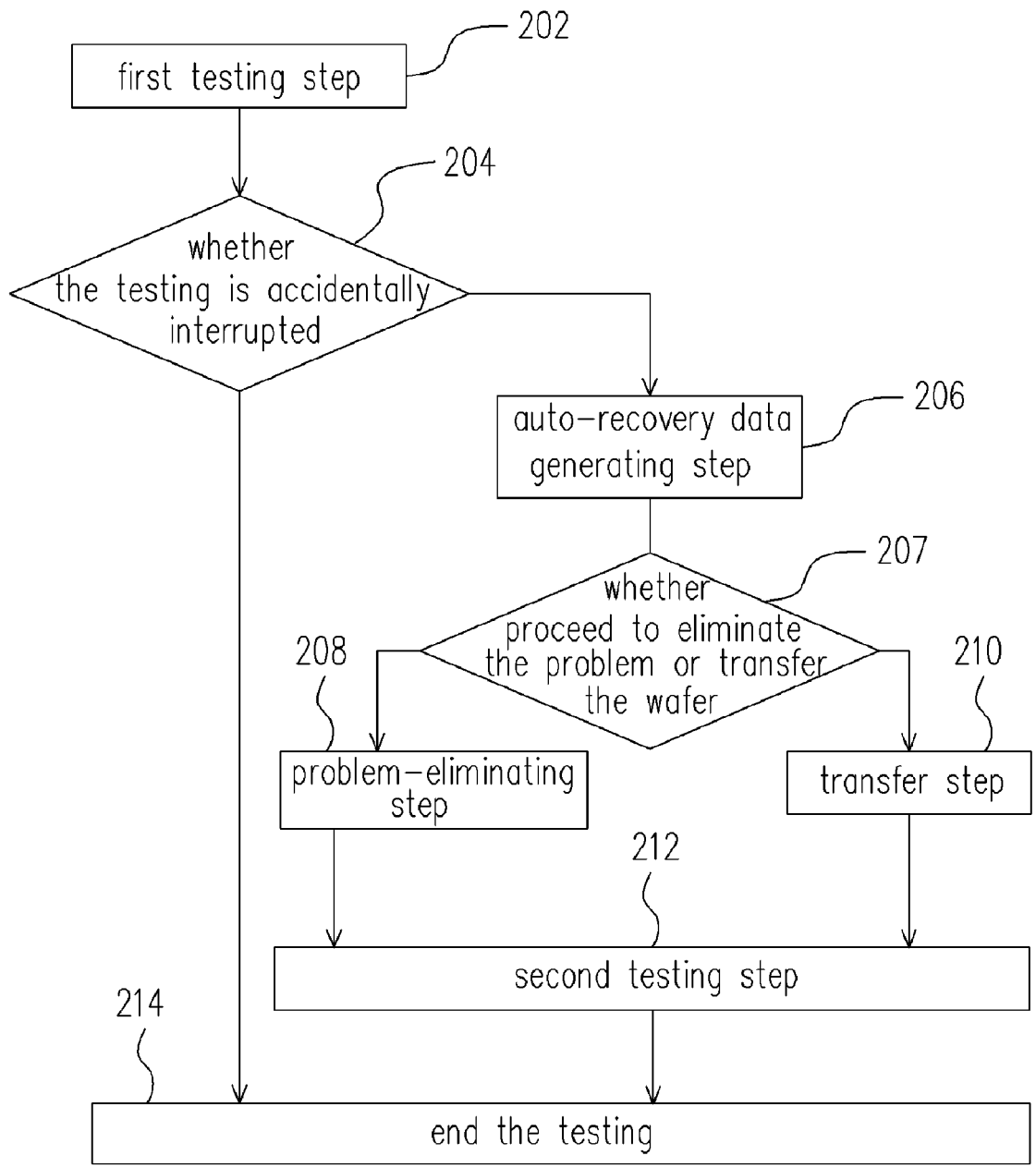
FIG. 2 is a flowchart illustrating an auto-recovery wafer testing method according to the present invention.

The following is a description of relevant procedures of an auto-recovery wafer testing method where the foregoing wafer testing apparatus is employed. FIG. 2 illustrates the auto-recovery wafer testing method according to the present invention.

First, a first testing unit is used to perform a first testing step (step 202), wherein, a batch of wafers are moved on to the wafer testing apparatus, while a main testing system of the testing apparatus reads out the relevant data (e.g., wafer batch number and process parameters) and carries out such performances as aligning the position of the wafer and relocating the testing apparatus to the initial position. Next, the first tester is used to perform testing sequentially on a plurality of the chips on the wafer, and a real-time accessing module is used to save the real-time testing data for each of the chips.

Next, as indicated by the step 204, if the testing procedure is successful, the testing procedure ends upon completion of the testing on the chips of each wafer (step 214), but if the testing procedure is accidentally interrupted, an auto-recovery data generating step is then carried out (step 206) so as to generate auto-recovery data based on the testing data saved in the real-time accessing module.

After the generation of the auto-recovery data (step 206), a choice is made (step 207) to perform a problem-eliminating step (step 208) on the first testing unit or perform a transfer step (step 210) to transfer the wafer from the first testing unit to a second testing unit. Wherein, if the step 208 is chosen, a second testing step (step 212) is carried out, after the problem is eliminated in the step 208, on the first testing unit where the testing is continued from the chip where the testing was interrupted on the basis of the auto-recovery data. If the step 210 is chosen, the second testing step (step 212) is carried out on the second testing unit where the testing is continued from the chip where the testing was interrupted on the basis of the auto-recovery data. Finally, the wafer testing ends as shown by the step 214.

In another aspect of the auto-recovery wafer testing apparatus and wafer testing method, after the loading of the wafer, a decision can be made whether to execute the auto-recovery, which will be based on the auto-recovery data storied in the tester and the relevant data of the current batch of the wafer read by the main system. Wherein, if it is decided not to execute the auto-recovery, the testing is performed starting from the initial position of the chip until the completion of the testing on the wafers of the same batch. On the other hand, if it is decided to execute the auto-recovery, the wafer data read by the main system is compared with the auto-recovery data to find out the position of the chip, where the prior testing was interrupted, from which the interrupted testing is then resumed to complete the testing on the wafer.

It is worthy of notice that the auto-recovery wafer testing apparatus and method of this invention are not only suitable for the foregoing-mentioned wafer probing in semi-conductor manufacturing processes, such as pre-test, post-test and sampling-test, but also suitable for, for example, laser trimming or products' final test. As for the wafer probing, the testing unit is a prober, and the prober is shifted sequentially to the position of each of the chips to measure the relevant resistance of the contacting pad of the chip and the circuit. As for laser trimming, on the other hand, the testing unit is, for example, a laser trimmer, and the laser trimmer performs a trimming process on the defective chip based on the results of prior electronic testing. As to either the former or the latter of the above, however, the auto-recovery wafer testing apparatus and method of this invention provide an effective solution for the problem of data losing caused by interruption of a testing process.

To sum up, according to the auto-recovery wafer testing apparatus and method of this invention, it can be avoided to reset the testing unit in an event of accidental interruption of the testing process. During the testing, the real-time accessing module in the wafer testing apparatus can record the real-time testing data for each of the chips and, whenever an accidental interruption occurs and resumption of the testing becomes necessary, output the automatically recovered data, such that the testing apparatus returns to the status prior to the interruption and that the testing unit returns to the position of the chip tested prior to the interruption for continuing to accomplish the testing process. Use of the auto-recovery wafer apparatus and method of this invention can save time spent for restarting the testing process due to testing interruption, avoid damages of chips due to repetitive testing, and thus increase the production efficiency.

It will be apparent to those skilled in the art that various modifications and variations can be made to the method and apparatus of the present invention without departing from the scope or spirit of the invention. In view of the foregoing, it is intended that the present invention covers modifications and variations of this invention provided they fall within the scope of the following claims and their equivalents.

What is claimed is:

1. An auto-recovery wafer testing method, comprising:
   a first testing step to test sequentially a plurality of chips on a wafer and spontaneously save testing data for each of the chips;
   an auto-recovery data generating step, wherein, if the first testing step is accidentally interrupted, auto-recovery data are generated based on the testing data that is saved; and
   a second testing step for continuing the testing, based on the auto-recovery data, from a chip being last but incompletely tested.

2. The wafer testing method as recited in claim 1, wherein, during the first testing step, a first testing unit is used to test the chips and output corresponding testing data for each of the chips.

3. The wafer testing method as recited in claim 1, wherein, during the first testing step, a real-time accessing module is used to instantaneously save testing data for each of the chips.

4. The wafer testing method as recited in claim 1, further comprising a problem-eliminating step, after the auto-recovery data generating step and before the second testing step, so as to ensure the first testing unit operating properly.

5. The wafer testing method as recited in claim 4, wherein, during the second testing step, the first testing unit is used for continuing the testing, based on the auto-recovery data, from a chip being last but incompletely tested.

6. The wafer testing method as recited in claim 1, further comprising a transfer step, after the auto-recovery data generating step and before the second testing step, so as to transfer the wafer from the first testing unit to a second testing unit.

7. The wafer testing method as recited in claim 6, during the second testing step, the second testing unit is used for continuing the testing, based on the auto-recovery data, from a chip being last but incompletely tested.

\* \* \* \* \*